United States Patent
Matsui

(10) Patent No.: US 12,308,242 B2
(45) Date of Patent: May 20, 2025

(54) ETCHING METHOD AND METHOD FOR MANUFACTURING SEMICONDUCTOR ELEMENT

(71) Applicant: SHOWA DENKO K.K., Tokyo (JP)

(72) Inventor: Kazuma Matsui, Tokyo (JP)

(73) Assignee: Resonac Corporation, Tokyo (JP)

( * ) Notice: Subject to any disclaimer, the term of this patent is extended or adjusted under 35 U.S.C. 154(b) by 627 days.

(21) Appl. No.: 17/595,397

(22) PCT Filed: Mar. 25, 2021

(86) PCT No.: PCT/JP2021/012618
§ 371 (c)(1),
(2) Date: Nov. 16, 2021

(87) PCT Pub. No.: WO2021/210368
PCT Pub. Date: Oct. 21, 2021

(65) Prior Publication Data
US 2022/0216063 A1 Jul. 7, 2022

(30) Foreign Application Priority Data

Apr. 14, 2020 (JP) .................................. 2020-072316

(51) Int. Cl.
*H01L 21/311* (2006.01)
(52) U.S. Cl.
CPC .............................. *H01L 21/31116* (2013.01)
(58) Field of Classification Search
None
See application file for complete search history.

(56) References Cited

U.S. PATENT DOCUMENTS

| | | |
|---|---|---|
| 5,534,107 A | 7/1996 | Gray et al. |
| 10,529,581 B2 | 1/2020 | Hsu et al. |

(Continued)

FOREIGN PATENT DOCUMENTS

| | | |
|---|---|---|
| EP | 1 932 941 A1 | 6/2008 |
| JP | 7-273088 A | 10/1995 |

(Continued)

OTHER PUBLICATIONS

International Search Report for PCT/JP2021/012618 dated Jun. 1, 2021.

(Continued)

*Primary Examiner* — Roberts P Culbert
(74) *Attorney, Agent, or Firm* — Sughrue Mion, PLLC

(57) ABSTRACT

Provided is an etching method capable of selectively etching an etching target containing a silicon compound including at least one of a nitrogen atom or an oxygen atom and a silicon atom with respect to a specific non-etching target without using plasma. The etching method includes an etching step in which an etching gas containing fluorine gas is brought into contact with a member to be etched including an etching target and a non-etching target in the absence of plasma to selectively etch the etching target with respect to the non-etching target. The etching target contains a silicon compound including at least one of a nitrogen atom or an oxygen atom and a silicon atom. The non-etching target includes at least one selected from tantalum, cobalt, copper, titanium nitride, nickel, and amorphous carbon. The etching step is performed under temperature conditions of from 40° C. to less than 350° C.

19 Claims, 1 Drawing Sheet

(56) References Cited

U.S. PATENT DOCUMENTS

| | | | |
|---|---|---|---|
| 2007/0087520 A1 | 4/2007 | Mitsuiki et al. | |
| 2009/0068844 A1 | 3/2009 | Pischtiak et al. | |
| 2010/0197143 A1 | 8/2010 | Nishimura et al. | |
| 2012/0164830 A1* | 6/2012 | Lee | H10B 12/0335 257/E21.585 |
| 2013/0017685 A1 | 1/2013 | Akae et al. | |
| 2018/0251679 A1 | 9/2018 | Takahashi et al. | |
| 2019/0206696 A1* | 7/2019 | Hsu | H01L 21/32135 |
| 2021/0233774 A1 | 7/2021 | Kato et al. | |

FOREIGN PATENT DOCUMENTS

| | | |
|---|---|---|
| JP | 2009-533853 A | 9/2009 |
| JP | 2013-197419 A | 9/2013 |
| JP | 5571770 B2 | 8/2014 |
| TW | 201931468 A | 8/2019 |
| WO | 2016/056300 A1 | 4/2016 |
| WO | 2019/245013 A1 | 12/2019 |

OTHER PUBLICATIONS

Ronald Hellriegel, et al., "Feasibility Study for Usage of Diluted Fluorine for Chamber Clean Etch Applications as an Environmental Friendly Replacement of $NF_3$", Materials Research Society, Materials Research Society Symposium Proceedings, Technology and Reliability of Low-k Dielectrics and Copper Interconnects, vol. 914, pp. 445-450, Apr. 18-21, 2006, U.S.A.

* cited by examiner

ETCHING METHOD AND METHOD FOR MANUFACTURING SEMICONDUCTOR ELEMENT

CROSS REFERENCE TO RELATED APPLICATIONS

This application is a National Stage of International Application No. PCT/JP2021/012618 filed Mar. 25, 2021, claiming priority based on Japanese Patent Application No. 2020-072316 filed Apr. 14, 2020.

TECHNICAL FIELD

The present invention relates to an etching method and a method for manufacturing a semiconductor element.

BACKGROUND ART

In semiconductor manufacturing processes, etching is used for patterning and removal of silicon compounds such as silicon oxide and silicon nitride. For example, PTL 1 discloses a method for etching silicon oxide using an etching gas containing fluorine gas ($F_2$) in the absence of plasma. Additionally, PTL 2 discloses a cleaning method for removing silicon nitride using fluorine gas in the absence of plasma. Hereinafter, etching methods that do not use plasma may be referred to as "plasmaless etching".

CITATION LIST

Patent Literature

PTL 1: JP 2009-533853 A
PTL 2: JP 5571770 B

SUMMARY OF INVENTION

Technical Problem

However, the methods disclosed in PTL 1 and 2 require high temperatures of 350° C. or higher to etch silicon compounds such as silicon oxide and silicon nitride, and therefore a large amount of energy is necessary for etching, as a result of which not only an etching target but also a non-etching target is etched, which is problematic.

An object of the present invention is to provide an etching method and a method for manufacturing a semiconductor element that allow an etching target containing a silicon compound including at least one of a nitrogen atom or an oxygen atom and a silicon atom to be selectively etched with respect to a specific non-etching target without using plasma.

Solution to Problem

In order to achieve the above object, an aspect of the present invention is as follows: [1] to [10].

[1] An etching method including an etching step in which an etching gas containing fluorine gas is brought into contact with a member to be etched including an etching target being a target of etching with the etching gas and a non-etching target not being the target of the etching with the etching gas in an absence of plasma to selectively etch the etching target with respect to the non-etching target, the etching target containing a silicon compound including at least one of a nitrogen atom or an oxygen atom and a silicon atom, the non-etching target including at least one selected from tantalum, cobalt, copper, titanium nitride, nickel, and amorphous carbon, and the etching step being performed under temperature conditions of from 40° C. to less than 350° C.

[2] The etching method according to [1], in which the silicon compound is at least one of silicon oxide or silicon nitride.

[3] The etching method according to [1] or [2], in which the etching step is performed under pressure conditions of from 1 Pa to 100 kPa.

[4] The etching method according to any one of [1] to [3], in which the etching step is performed under temperature conditions of from 70° C. to 330° C.

[5] The etching method according to any one of [1] to [4], in which the etching gas is a gas comprising only fluorine gas or is a mixed gas containing fluorine gas and inert gas.

[6] The etching method according to [5], in which the inert gas is at least one selected from nitrogen gas, helium, argon, neon, krypton, and xenon.

[7] The etching method according to any one of [1] to [6], in which an amount of the fluorine gas contained in the etching gas is from 0.5% by volume to 70% by volume.

[8] The etching method according to any one of [1] to [7], in which the non-etching target is used as a resist in the etching of the etching target with the etching gas.

[9] The etching method according to any one of [1] to [8], in which an etching selectivity ratio being a ratio of an etching rate of the etching target to an etching rate of the non-etching target is 3 or more.

[10] A method for manufacturing a semiconductor element, the method using the etching method according to any one of [1] to [9] to manufacture the semiconductor element, in which the member to be etched is a semiconductor substrate including the etching target and the non-etching target, and which method includes a processing step of removing at least a part of the etching target from the semiconductor substrate by the etching.

Advantageous Effects of Invention

According to the present invention, an etching target that contains a silicon compound including at least one of a nitrogen atom or an oxygen atom and a silicon atom can be selectively etched with respect to a specific non-etching target without using plasma.

BRIEF DESCRIPTION OF DRAWINGS

FIG. 2 is a diagram illustrating a member to be etched used in Example 1 and the like; and FIG. 3 is a diagram illustrating a member to be etched used in Example 20 and the like.

DESCRIPTION OF EMBODIMENTS

Figure 1:
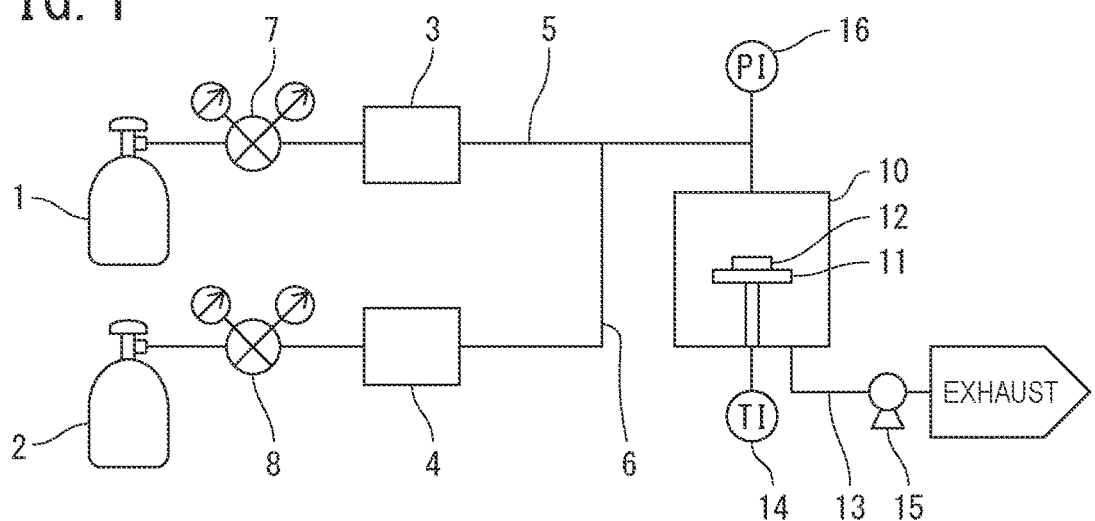
FIG. 1 is a schematic diagram of an example of an etching device that illustrates an embodiment of an etching method according to the present invention.

An embodiment of the present invention will be described below. It should be noted that the present embodiment is illustrative of an example of the present invention, and the present invention is not limited thereto. Additionally, various changes or improvements can be added to the present embodiment, and embodiments added with such changes or improvements may also be included in the present invention.

An etching method according to the present embodiment includes an etching step in which an etching gas containing fluorine gas ($F_2$) is brought into contact with a member to be etched including an etching target being a target of etching with the etching gas and a non-etching target not being the target of the etching with the etching gas in an absence of plasma to selectively etch the etching target with respect to the non-etching target.

The etching target contains a silicon compound including at least one of a nitrogen atom (N) or an oxygen atom (O) and a silicon atom (Si). Additionally, the non-etching target includes at least one selected from tantalum (Ta), cobalt (Co), copper (Cu), titanium nitride (TiN), nickel (Ni), and amorphous carbon (C). Then, in the etching method according to the present embodiment, the etching step is performed under temperature conditions of from 40° C. to less than 350° C.

When the etching gas is brought into contact with the member to be etched, the fluorine gas in the etching gas reacts with the silicon compound in the etching target, whereby etching of the etching target proceeds. On the other hand, since the non-etching target hardly reacts with the fluorine gas, etching of the non-etching target hardly proceeds. Thus, according to the etching method according to the present embodiment, the etching target can be selectively etched with respect to the non-etching target without using plasma.

Since the etching target can be etched without using plasma, it is unnecessary to etch using an expensive plasma generation device. This allows for low cost etching of the member to be etched. In addition, since plasma is not used, it is less likely to cause corrosion in a member forming the etching device (for example, a chamber), a pipe connected to the etching device, a member forming a device for manufacturing a semiconductor element described later (for example, a chamber), a pipe connected to the device for manufacturing a semiconductor element described later, and the like.

It should be noted that the etching meant in the present invention includes processing the etching target into a predetermined shape (for example, a three-dimensional shape) by removing a part or all of the etching target included in the member to be etched (for example, processing the etching target in film form comprising the silicon compound into a predetermined film thickness) and cleaning the member to be etched by removing a residue or deposit comprising the etching target from the member to be etched.

The etching method according to the present embodiment can be used in the manufacturing of semiconductor elements. In other words, a method for manufacturing a semiconductor element according to the present embodiment is a method for manufacturing a semiconductor element that uses the etching method according to the present embodiment to manufacture the semiconductor element, in which the member to be etched is a semiconductor substrate including an etching target and a non-etching target, and which method includes a processing step of removing at least a part of the etching target from the semiconductor substrate by the etching.

For example, in the etching method according to the present embodiment, the etching proceeds more promptly in silicon nitride (for example, $Si_3N_4$) than in silicon oxide (for example, $SiO_2$). By taking advantage of the characteristics, the etching method according to the present embodiment can be used to manufacture semiconductor elements such as 3D-NAND flash memory and logic devices.

Figure 3:
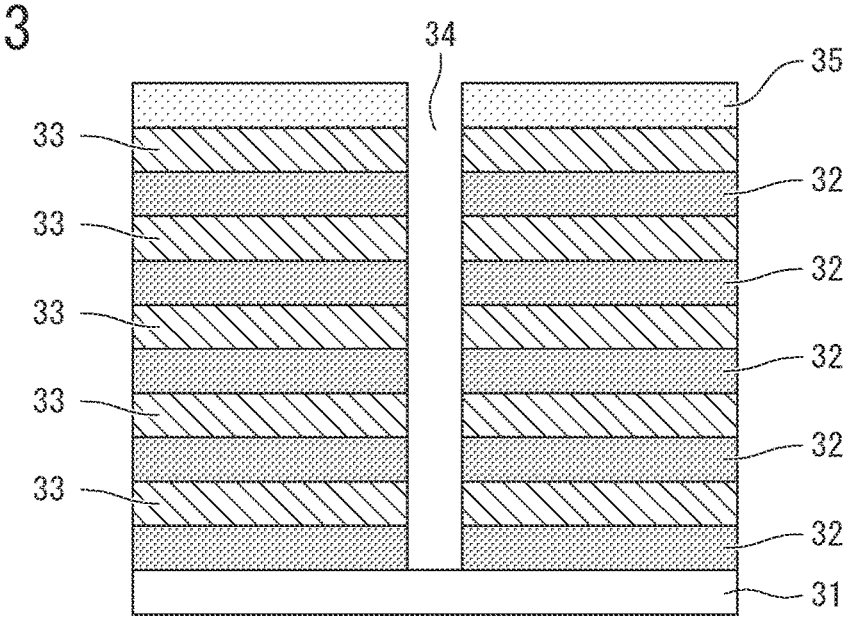

For example, a laminate comprising alternately laminated silicon oxide films and silicon nitride films is formed with a through hole extending along a laminating direction and penetrating through the laminate (see FIG. 3). Then, by applying the etching method according to the present embodiment to this laminate, the silicon nitride films exposed on an inner surface of the through hole are selectively and isotropically etched, thereby enabling formation of a structure in which end portions of the silicon oxide films protrude in the through hole. A process of forming a structural body having such a structure can be used in the manufacturing of semiconductor elements such as 3D-NAND flash memory and logic devices, since the structural body can be used as that of a semiconductor element.

The process of forming the above structure by etching has conventionally been performed using a chemical solution containing phosphoric acid or the like. However, etching with etching gas is superior to etching with a chemical solution in terms of micro-machinability. Therefore, the etching method according to the present embodiment is expected to contribute to further miniaturization and higher integration of semiconductor elements.

In addition, similarly, when using the non-etching target itself as the structural body of a semiconductor element, a material that does not substantially react with fluorine gas or a material that is extremely slow to react with fluorine gas is used as the non-etching target. Specific examples of the material usable herein include at least one selected from tantalum, cobalt, copper, titanium nitride, nickel, and amorphous carbon.

Furthermore, the etching method according to the present embodiment can also be used for cleaning, as described above. For example, after performing, in the chamber, a step of forming a film comprising a material containing the silicon compound on a substrate and a step of etching the film of the material containing the silicon compound formed on the substrate, cleaning can be performed by removing a deposit containing the silicon compound adhering to the inner surface of the chamber using the etching method according to the present embodiment. Note that in such cleaning, the chamber corresponds to a member to be etched being a constituent element of the present invention, and the deposit corresponds to an etching target being a constituent element of the present invention.

Hereinafter, a more detailed description will be given of the etching method and the method for manufacturing a semiconductor element according to the present embodiment.

[Etching Gas]

The etching gas is a gas that contains fluorine gas. The etching gas may be a gas comprising only fluorine gas or a mixed gas containing fluorine gas and another kind of gas. When the etching gas is a mixed gas containing fluorine gas and another kind of gas, the amount of the fluorine gas contained in the etching gas is preferably from 0.5% by volume to 70% by volume, more preferably from 1% by volume to 60% by volume, and still more preferably from 5% by volume to 50% by volume.

When the etching gas is a mixed gas containing fluorine gas and another kind of gas, inert gas can be used as the other kind of gas. In other words, the etching gas may be a mixed gas comprising fluorine gas and inert gas. As the inert gas, at least one selected from nitrogen gas ($N_2$), helium (He), neon (Ne), argon (Ar), krypton (Kr), and xenon (Xe) can be used. The amount of the inert gas contained in the etching gas is not particularly limited, but may be more than 0% by volume and 99% by volume or less.

[Pressure Conditions for Etching Step]

Pressure conditions for the etching step in the etching method according to the present embodiment are not particularly limited, but are preferably from 1 Pa to 100 kPa, more preferably from 100 Pa to 80 kPa, and still more preferably from 1 kPa to 60 kPa.

For example, the member to be etched is placed in the chamber, and etching can be performed while distributing the etching gas in the chamber. The pressure in the chamber during the distribution of the etching gas can be from 1 Pa to 100 kPa. The flow rate of the etching gas may be appropriately set according to the size of the chamber and the capacity of an exhaust system for reducing the pressure in the chamber so that the pressure in the chamber is maintained constant.

[Temperature Conditions for Etching Step]

Temperature conditions for the etching step in the etching method according to the present embodiment are needed to be from 40° C. to less than 350° C., but are preferably from 70° C. to 330° C., and more preferably from 130° C. to 300° C. Here, although the temperature of the temperature conditions refers to the temperature of the member to be etched, the temperature of the stage supporting the member to be etched placed in the chamber of the etching device can also be used.

When the temperature conditions are 40° C. or more, the etching rate of the silicon compound being the etching target tends to be higher. On the other hand, when the temperature conditions are less than 350° C., etching can be performed without requiring excessive time and energy. Advantageous points include small load on the etching device and a device for manufacturing a semiconductor element and suppression of etching of a portion that should originally not be etched (for example, a non-etching target).

Fluorine gas hardly reacts with the non-etching target including at least one of tantalum, cobalt, copper, titanium nitride, nickel, or amorphous carbon in the absence of plasma and under temperature conditions of less than 350° C. Therefore, using the etching method according to the present embodiment allows the etching target to be selectively etched without hardly etching the non-etching target. Thus, the etching method according to the present embodiment can be used for methods such as processing an etching target into a predetermined shape by using a patterned non-etching target as a resist or a mask.

Furthermore, when temperatures of the etching target and the non-etching target are less than 350° C., etching selectivity ratio is likely to be high. For example, the etching selectivity ratio, which is a ratio of an etching rate of the etching target to an etching rate of the non-etching target, is likely to be 3 or more. The etching selectivity ratio is preferably 3 or more, more preferably 5 or more, and still more preferably 10 or more.

[Member to be Etched]

The member to be etched that is subjected to etching by the etching method according to the present embodiment includes an etching target and a non-etching target. The member to be etched may be a member that includes a portion formed by the etching target and a portion formed by the non-etching target or a member formed by a mixture of the etching target and the non-etching target. The member to be etched may also include something other than the etching target and the non-etching target.

In addition, the shape of the member to be etched is not particularly limited, and, for example, may be in plate, foil, film, powder, or lump form. An example of the member to be etched is the above-mentioned semiconductor substrate.

[Etching Target]

The etching target contains a silicon compound that includes at least one of a nitrogen atom or an oxygen atom and a silicon atom. The etching target may be either one comprising the silicon compound or one comprising a mixture that contains the silicon compound. Additionally, the silicon compound may be at least one of silicon oxide or silicon nitride.

Silicon nitride refers to a compound including silicon and nitrogen in any ratio, and an example thereof is $Si_3N_4$. Silicon nitride purity is not particularly limited, but preferably 30% by mass or more, more preferably 60% by mass or more, and still more preferably 90% by mass or more.

Silicon oxide refers to a compound including silicon and oxygen in any ratio, and an example thereof is $SiO_2$. Silicon oxide purity is not particularly limited, but is preferably 30% by mass or more, more preferably 60% by mass or more, and still more preferably 90% by mass or more.

In addition, the shape of the etching target is not particularly limited, and for example, may be in plate, foil, film, powder, or lump form.

[Non-Etching Target]

The non-etching target includes at least one selected from tantalum, cobalt, copper, titanium nitride, nickel, and amorphous carbon, which do not substantially react with fluorine gas or are extremely late to react with fluorine gas. Therefore, even when etching is performed by the etching method according to the present embodiment, the etching hardly proceeds.

Additionally, the non-etching target can be used as a resist for suppressing the etching of the etching target with etching gas. Thus, the etching method according to the present embodiment can be used for methods such as processing an etching target into a predetermined shape (for example, processing a film-formed etching target included in a member to be etched into a predetermined film thickness) by using a patterned non-etching target as a resist or a mask. Accordingly, the etching method according thereto is suitable for use in manufacturing semiconductor elements. Furthermore, since the non-etching target is hardly etched, etching of a portion that should originally not be etched in a semiconductor element can be suppressed, which can prevent characteristics of the semiconductor element from being lost due to the etching.

Note that the non-etching target left after patterning can be removed by a removal method commonly used in semiconductor element manufacturing processes. Examples of the removal method include ashing with oxidizing gases such as oxygen plasma and ozone and dissolution and removal methods using chemicals such as APM (a mixture of ammonia water and hydrogen peroxide water), SPM (a mixture of sulfuric acid and hydrogen peroxide water), and organic solvents.

Next, a configuration example of an etching device capable of performing the etching method according to the present embodiment and an example of the etching method using the etching device will be described with reference to FIG. 1. The etching device of FIG. 1 is a plasmaless etching device without using plasma. First will be a description of the etching device of FIG. 1.

The etching device of FIG. 1 includes a chamber 10 inside which etching is performed, a stage 11 that supports, in the chamber 10, a member to be etched 12 that is subjected to etching, a thermometer 14 that measures temperature of the member to be etched 12, an exhaust pipe 13 for exhausting a gas in the chamber 10, a vacuum pump 15 provided on the exhaust pipe 13 to reduce pressure in the chamber 10, and a pressure gauge 16 that measures the pressure in the chamber 10.

The etching device of FIG. 1 also includes an etching gas supply unit that supplies an etching gas into the chamber 10. The etching gas supply unit includes a fluorine gas supply unit 1 that supplies fluorine gas, an inert gas supply unit 2 that supplies an inert gas, a fluorine gas supply pipe 5 that connects the fluorine gas supply unit 1 to the chamber 10, and an inert gas supply pipe 6 that connects the inert gas supply unit 2 to an intermediate portion of the fluorine gas supply pipe 5.

Furthermore, the fluorine gas supply pipe 5 is provided with a fluorine gas pressure control device 7 that controls pressure of the fluorine gas and a fluorine gas flow rate control device 3 that controls flow rate of the fluorine gas. Still furthermore, the inert gas supply pipe 6 is provided with an inert gas pressure control device 8 that controls pressure of the inert gas and an inert gas flow rate control device 4 that controls flow rate of the inert gas.

Then, when fluorine gas is supplied as the etching gas to the chamber 10, the fluorine gas is supplied to the chamber 10 via the fluorine gas supply pipe 5 by sending the fluorine gas out from the fluorine gas supply unit 1 to the fluorine gas supply pipe 5.

Additionally, when the mixed gas of fluorine gas and inert gas is supplied as the etching gas, the fluorine gas is sent out from the fluorine gas supply unit 1 to the fluorine gas supply pipe 5, and also the inert gas is sent out from the inert gas supply unit 2 to the fluorine gas supply pipe 5 via the inert gas supply pipe 6. As a result, the fluorine gas and the inert gas are mixed together at the intermediate point of the fluorine gas supply pipe 5 to form a mixed gas, and the mixed gas is supplied to the chamber 10 via the fluorine gas supply pipe 5.

Note that configurations of the fluorine gas supply unit 1 and the inert gas supply unit 2 are not particularly limited, and, for example, they may be tanks or cylinders. In addition, examples of the fluorine gas flow rate control device 3 and the inert gas flow rate control device 4 usable herein include mass flow controllers and flow meters.

When supplying the etching gas to the chamber 10, it is preferable to supply the etching gas while maintaining supply pressure of the etching gas (i.e., a value of the fluorine gas pressure control device 7 in FIG. 1) at a predetermined value. Specifically, the supply pressure of the etching gas is preferably from 1 kPa to 1.0 MPa, more preferably from 5 kPa to 0.7 MPa, and still more preferably from 10 kPa to 0.5 MPa. When the supply pressure of the etching gas is within the above range, the etching gas is smoothly supplied to the chamber 10, and load on components (for example, the various devices and the pipes) included in the etching device of FIG. 1 is small.

Additionally, the pressure of the etching gas supplied into the chamber 10 is preferably from 1 Pa to 100 kPa, more preferably from 100 Pa to 80 kPa, and still more preferably from 1 kPa to 60 kPa, from the viewpoint of uniform etching of a surface of the member to be etched 12. When the pressure of the etching gas in the chamber 10 is within the above range, a sufficient etching rate can be obtained, and the etching selectivity ratio is likely to be high.

The pressure in the chamber 10 before supplying the etching gas is not particularly limited as long as it is equal to or lower than the supply pressure of the etching gas or lower than the supply pressure of the etching gas. However, for example, the pressure in the chamber 10 is preferably from $10^{-5}$ Pa to less than 10 kPa, and more preferably from 1 Pa to 2 kPa.

A differential pressure between the supply pressure of the etching gas and the pressure in the chamber 10 before supplying the etching gas is preferably 1.0 MPa or less, more preferably 0.5 MPa or less, and still more preferably 0.3 MPa or less. When the differential pressure is within the above range, smooth supply of the etching gas to the chamber 10 is facilitated.

When supplying the etching gas to the chamber 10, it is preferable to supply the etching gas while maintaining the temperature of the etching gas at a predetermined value. Specifically, the supply temperature of the etching gas is preferably from 0° C. to 150° C.

The temperature of the member to be etched 12 during etching is needed to be from 40° C. to less than 350° C., is preferably from 70° C. to 330° C., and more preferably from 130° C. to 300° C. When the temperature thereof is within the above temperature range, the etching of the etching target (particularly, silicon nitride) included in the member to be etched 12 proceeds smoothly, and the load on the etching device is small, which facilitates life extension of the etching device.

The processing time for the etching (hereinafter may be referred to as "etching time") can be set optionally depending on how much the etching of the etching target included in the member to be etched 12 is desired. However, when considering the production efficiency of the semiconductor element manufacturing processes, the etching time is preferably within 60 minutes, more preferably within 40 minutes, and still more preferably within 30 minutes. Note that the etching time refers to a time from when the etching gas is introduced into the chamber 10 to when the etching gas in the chamber 10 is exhausted in order to finish etching.

The etching method according to the present embodiment can be performed using a common plasmaless etching device used in the semiconductor element manufacturing processes, such as the etching device of FIG. 1, and the configuration of the etching device usable herein is not particularly limited.

For example, a positional relationship between the fluorine gas supply pipe 5 and the member to be etched 12 is not particularly limited as long as the etching gas can be brought into contact with the member to be etched 12. It also suffices that the configuration of a temperature control mechanism of the chamber 10 allows the temperature of the member to be etched 12 to be controlled to any temperature. Accordingly, the temperature control mechanism may be directly provided on the stage 11, or the chamber 10 may be heated or cooled by an external temperature controller from outside the chamber 10.

In addition, the material of the etching device of FIG. 1 is not particularly limited as long as it has a corrosion resistance to fluorine gas and allows depressurization to a predetermined pressure. For example, a portion of the etching device brought into contact with the etching gas can be made of a metal such as nickel, a nickel-based alloy, aluminum, stainless steel, platinum, copper, or cobalt, a ceramic such as alumina, a fluororesin, or the like.

Specific examples of the nickel-based alloy include INCONEL (registered trademark), HASTELLOY (registered trademark), and MONEL (registered trademark). Additionally, examples of the fluororesin include polytetrafluoroethylene (PTFE), polychlorotrifluoroethylene (PCTFE), tetrafluoroethylene perfluoroalkoxyethylene copolymer (PFA), polyvinylidene fluoride (PVDF), TEFLON (registered trademark), VITON (registered trademark), and KALREZ (registered trademark).

EXAMPLES

Hereinafter, the present invention will be described in more detail with reference to Examples, Comparative Examples, and Reference Example.

Example 1

Using an etching device having substantially the same configuration as that of the etching device of FIG. 1, etching of a member to be etched was performed. The member to be etched used in Example 1 will be described with reference to FIG. 2.

Figure 2:
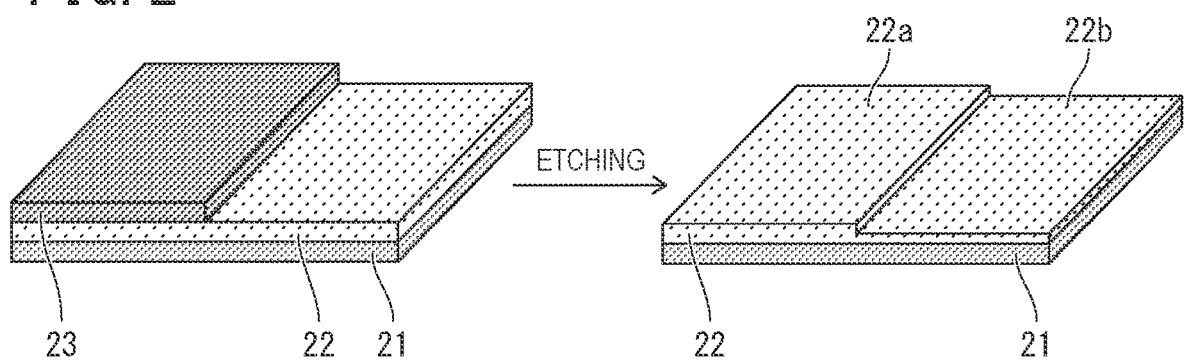

There was prepared a square silicon substrate 21 having a 2 inch side length formed with a silicon nitride film 22 having a film thickness of 3 μm thereon (manufactured by KST World Corporation). A rectangular nickel substrate 23 having a size of 1 inch×2 inch was glued onto the silicon nitride film 22 using grease (DEMNUM GREASE L-200 manufactured by Daikin Industries, Ltd.) to form a laminate. The laminate thus formed was used as the member to be etched. As illustrated in FIG. 2, the nickel substrate 23 was glued to cover approximately a half portion of the silicon nitride film 22. Note that the silicon nitride film 22 was an etching target, and the nickel substrate 23 being a non-etching target was used as a resist.

Additionally, in the above member to be etched, the silicon nitride film 22 being the etching target was replaced with a film of each of elemental tantalum, elemental cobalt, elemental copper, titanium nitride, elemental nickel, and amorphous carbon, which are non-etching targets, to form laminates for comparison.

The above member to be etched and the six laminates for comparison were placed side by side on a stage in a chamber of the etching device, and the temperature of the stage was raised to 150° C.

Next, fluorine gas at a flow rate of 50 mL/min and argon at a flow rate of 450 mL/min were mixed together to form a mixed gas, and the mixed gas was used as an etching gas. Then, the etching gas was supplied into the chamber at a flow rate of 500 mL/min and distributed for 3 minutes for etching. As a result, an exposed portion of the silicon nitride film 22 not covered by the nickel substrate 23 in the member to be etched was etched. The pressure in the chamber during the distribution of the etching gas was 10 kPa, and the fluorine gas had a partial pressure of 1 kPa. After completion of the distribution of the etching gas, the heating of the stage was stopped, and the atmosphere in the chamber was replaced with argon.

After the etching finished, the chamber was opened to take out the member to be etched. The nickel substrate 23 was removed from the member to be etched taken out, and the glued surface thereof was washed with ethanol to remove the grease. Then, using an atomic force microscope VN-8010 manufactured by Keyence Corporation, the size of a step difference between a covered surface 22a of the silicon nitride film 22 covered by the nickel substrate 23 and not etched and an etched surface 22b of the silicon nitride film 22 not covered by the nickel substrate 23 and etched was measured. The size of the measured step difference (nm) was divided by the etching time (min) to calculate a silicon nitride etching rate (nm/min). Table 1 illustrates the result.

Furthermore, for the six laminates for comparison as well, the same operation as that for the member to be etched was performed, and an etching rate (nm/min) of each of elemental tantalum, elemental cobalt, elemental copper, titanium nitride, elemental nickel, and amorphous carbon was calculated by dividing the size (nm) of the step difference by the etching time (min). Table 1 illustrates the results.

Note that conditions for measuring the size of the step difference using the atomic force microscope are as follows:
Measurement pressure: atmospheric pressure (101.3 kPa)
Measurement temperature: 28° C.
Measurement atmosphere: air atmosphere
Scanning range: 80.0 μm in width, 20.0 μm in height, 0° in angle.

TABLE 1

| | Etching gas | | Stage | In-chamber | Etching | | | Etching |
| | Composition | Volume ratio*) | temperature (° C.) | pressure (kPa) | time (min) | Etching rate (nm/min) | | selectivity ratio |
| | | | | | | Etching target | Non-etching target | |
| Ex. 1 | $F_2$/Ar | 10/90 | 150 | 10 | 3 | Silicon nitride 60 | Elemental tantalum — Less than 0.1 | More than 600 |
| | | | | | | | Elemental cobalt — Less than 0.1 | More than 600 |
| | | | | | | | Elemental copper — Less than 0.1 | More than 600 |
| | | | | | | | Titanium nitride — Less than 0.1 | More than 600 |
| | | | | | | | Elemental nickel — Less than 0.1 | More than 600 |
| | | | | | | | Amorphous carbon — 1 | 60 |
| Ex. 2 | $F_2$/Ar | 10/90 | 150 | 10 | 3 | Silicon oxide 5 | Elemental tantalum — Less than 0.1 | More than 50 |
| | | | | | | | Elemental cobalt — Less than 0.1 | More than 50 |
| | | | | | | | Elemental copper — Less than 0.1 | More than 50 |
| | | | | | | | Titanium nitride — Less than 0.1 | More than 50 |
| | | | | | | | Elemental nickel — Less than 0.1 | More than 50 |
| | | | | | | | Amorphous carbon — 1 | 5 |

TABLE 1-continued

| | Etching gas | | Stage temperature (° C.) | In-chamber pressure (kPa) | Etching time (min) | Etching rate (nm/min) | | | Etching selectivity ratio |
|---|---|---|---|---|---|---|---|---|---|
| | Composition | Volume ratio*) | | | | Etching target | | Non-etching target | |
| Ex. 3 | $F_2$/Ar | 10/90 | 80 | 10 | 3 | Silicon nitride | 20 | Elemental tantalum | Less than 0.1 | More than 200 |
| | | | | | | | | Elemental cobalt | Less than 0.1 | More than 200 |
| | | | | | | | | Elemental copper | Less than 0.1 | More than 200 |
| | | | | | | | | Titanium nitride | Less than 0.1 | More than 200 |
| | | | | | | | | Elemental nickel | Less than 0.1 | More than 200 |
| | | | | | | | | Amorphous carbon | Less than 0.1 | More than 200 |
| Ex. 4 | $F_2$/Ar | 10/90 | 80 | 10 | 3 | Silicon oxide | 1 | Elemental tantalum | Less than 0.1 | More than 10 |
| | | | | | | | | Elemental cobalt | Less than 0.1 | More than 10 |
| | | | | | | | | Elemental copper | Less than 0.1 | More than 10 |
| | | | | | | | | Titanium nitride | Less than 0.1 | More than 10 |
| | | | | | | | | Elemental nickel | Less than 0.1 | More than 10 |
| | | | | | | | | Amorphous carbon | Less than 0.1 | More than 10 |
| Ex. 5 | $F_2$/Ar | 10/90 | 290 | 10 | 3 | Silicon nitride | 172 | Elemental tantalum | Less than 0.1 | More than 1720 |
| | | | | | | | | Elemental cobalt | Less than 0.1 | More than 1720 |
| | | | | | | | | Elemental copper | Less than 0.1 | More than 1720 |
| | | | | | | | | Titanium nitride | Less than 0.1 | More than 1720 |
| | | | | | | | | Elemental nickel | Less than 0.1 | More than 1720 |
| | | | | | | | | Amorphous carbon | 4 | 43 |
| Ex. 6 | $F_2$/Ar | 10/90 | 290 | 10 | 3 | Silicon oxide | 45 | Elemental tantalum | Less than 0.1 | More than 450 |
| | | | | | | | | Elemental cobalt | Less than 0.1 | More than 450 |
| | | | | | | | | Elemental copper | Less than 0.1 | More than 450 |
| | | | | | | | | Titanium nitride | Less than 0.1 | More than 450 |
| | | | | | | | | Elemental nickel | Less than 0.1 | More than 450 |
| | | | | | | | | Amorphous carbon | 4 | 11 |
| Ex. 7 | $F_2$/Ar | 1/99 | 150 | 10 | 3 | Silicon nitride | 5 | Elemental tantalum | Less than 0.1 | More than 50 |
| | | | | | | | | Elemental cobalt | Less than 0.1 | More than 50 |
| | | | | | | | | Elemental copper | Less than 0.1 | More than 50 |
| | | | | | | | | Titanium nitride | Less than 0.1 | More than 50 |
| | | | | | | | | Elemental nickel | Less than 0.1 | More than 50 |
| | | | | | | | | Amorphous carbon | Less than 0.1 | More than 50 |
| Ex. 8 | $F_2$/Ar | 1/99 | 150 | 10 | 3 | Silicon oxide | 1 | Elemental tantalum | Less than 0.1 | More than 10 |
| | | | | | | | | Elemental cobalt | Less than 0.1 | More than 10 |
| | | | | | | | | Elemental copper | Less than 0.1 | More than 10 |
| | | | | | | | | Titanium nitride | Less than 0.1 | More than 10 |
| | | | | | | | | Elemental nickel | Less than 0.1 | More than 10 |
| | | | | | | | | Amorphous carbon | Less than 0.1 | More than 10 |

*)A volume ratio of fluorine gas to inert gas. For example, when fluorine gas:inert gas = 10:90, it is described as 10/90.

Examples 2 to 18

As the etching target, a silicon oxide film or a silicon nitride film was used as listed in Tables 1 to 3, and etching conditions (etching gas composition, stage temperature, in-chamber pressure, and etching time) were set as listed in Tables 1 to 3 to perform etching in the same manner as in Example 1. Then, an etching rate of each of the etching target, elemental tantalum, elemental cobalt, elemental copper, titanium nitride, elemental nickel, and amorphous carbon was calculated. Table 1 to 3 illustrate the results.

TABLE 2

| | Etching gas | | Stage | In-chamber | Etching | | | Etching rate (nm/min) | | Etching selectivity |
|---|---|---|---|---|---|---|---|---|---|---|
| | Composition | Volume ratio*) | temperature (° C.) | pressure (kPa) | time (min) | Etching target | | Non-etching target | | ratio |
| Ex. 9 | $F_2$/Ar | 50/50 | 150 | 10 | 3 | Silicon nitride | 989 | Elemental tantalum | Less than 0.1 | More than 9890 |
| | | | | | | | | Elemental cobalt | Less than 0.1 | More than 9890 |
| | | | | | | | | Elemental copper | Less than 0.1 | More than 9890 |
| | | | | | | | | Titanium nitride | Less than 0.1 | More than 9890 |
| | | | | | | | | Elemental nickel | Less than 0.1 | More than 9890 |
| | | | | | | | | Amorphous carbon | 18 | 55 |
| Ex. 10 | $F_2$/Ar | 50/50 | 150 | 10 | 3 | Silicon oxide | 218 | Elemental tantalum | Less than 0.1 | More than 2180 |
| | | | | | | | | Elemental cobalt | Less than 0.1 | More than 2180 |
| | | | | | | | | Elemental copper | Less than 0.1 | More than 2180 |
| | | | | | | | | Titanium nitride | Less than 0.1 | More than 2180 |
| | | | | | | | | Elemental nickel | Less than 0.1 | More than 2180 |
| | | | | | | | | Amorphous carbon | 18 | 12 |
| Ex. 11 | $F_2$/Ar | 10/90 | 150 | 1 | 3 | Silicon nitride | 21 | Elemental tantalum | Less than 0.1 | More than 210 |
| | | | | | | | | Elemental cobalt | Less than 0.1 | More than 210 |
| | | | | | | | | Elemental copper | Less than 0.1 | More than 210 |
| | | | | | | | | Titanium nitride | Less than 0.1 | More than 210 |
| | | | | | | | | Elemental nickel | Less than 0.1 | More than 210 |
| | | | | | | | | Amorphous carbon | Less than 0.1 | More than 210 |
| Ex. 12 | $F_2$/Ar | 10/90 | 150 | 1 | 3 | Silicon oxide | 2 | Elemental tantalum | Less than 0.1 | More than 20 |
| | | | | | | | | Elemental cobalt | Less than 0.1 | More than 20 |
| | | | | | | | | Elemental copper | Less than 0.1 | More than 20 |
| | | | | | | | | Titanium nitride | Less than 0.1 | More than 20 |
| | | | | | | | | Elemental nickel | Less than 0.1 | More than 20 |
| | | | | | | | | Amorphous carbon | Less than 0.1 | More than 20 |
| Ex. 13 | $F_2$/Ar | 10/90 | 150 | 60 | 3 | Silicon nitride | 915 | Elemental tantalum | Less than 0.1 | More than 9150 |
| | | | | | | | | Elemental cobalt | Less than 0.1 | More than 9150 |
| | | | | | | | | Elemental copper | Less than 0.1 | More than 9150 |
| | | | | | | | | Titanium nitride | Less than 0.1 | More than 9150 |
| | | | | | | | | Elemental nickel | Less than 0.1 | More than 9150 |
| | | | | | | | | Amorphous carbon | 23 | 40 |

TABLE 2-continued

| | Etching gas | | Stage temperature (° C.) | In-chamber pressure (kPa) | Etching time (min) | Etching rate (nm/min) | | | Etching selectivity ratio |
|---|---|---|---|---|---|---|---|---|---|
| | Composition | Volume ratio*) | | | | Etching target | | Non-etching target | |
| Ex. 14 | $F_2$/Ar | 10/90 | 150 | 60 | 3 | Silicon oxide | 290 | Elemental tantalum | Less than 0.1 | More than 2900 |
| | | | | | | | | Elemental cobalt | Less than 0.1 | More than 2900 |
| | | | | | | | | Elemental copper | Less than 0.1 | More than 2900 |
| | | | | | | | | Titanium nitride | Less than 0.1 | More than 2900 |
| | | | | | | | | Elemental nickel | Less than 0.1 | More than 2900 |
| | | | | | | | | Amorphous carbon | 23 | 13 |
| Ex. 15 | $F_2$/$N_2$ | 10/90 | 150 | 10 | 3 | Silicon nitride | 62 | Elemental tantalum | Less than 0.1 | More than 620 |
| | | | | | | | | Elemental cobalt | Less than 0.1 | More than 620 |
| | | | | | | | | Elemental copper | Less than 0.1 | More than 620 |
| | | | | | | | | Titanium nitride | Less than 0.1 | More than 620 |
| | | | | | | | | Elemental nickel | Less than 0.1 | More than 620 |
| | | | | | | | | Amorphous carbon | 1 | 62 |
| Ex. 16 | $F_2$/$N_2$ | 10/90 | 150 | 10 | 3 | Silicon oxide | 5 | Elemental tantalum | Less than 0.1 | More than 50 |
| | | | | | | | | Elemental cobalt | Less than 0.1 | More than 50 |
| | | | | | | | | Elemental copper | Less than 0.1 | More than 50 |
| | | | | | | | | Titanium nitride | Less than 0.1 | More than 50 |
| | | | | | | | | Elemental nickel | Less than 0.1 | More than 50 |
| | | | | | | | | Amorphous carbon | 1 | 5 |

*)A volume ratio of fluorine gas to inert gas. For example, when fluorine gas:inert gas = 10:90, it is described as 10/90.

TABLE 3

| | Etching gas | | Stage temperature (° C.) | In-chamber pressure (kPa) | Etching time (min) | Etching rate (nm/min) | | | Etching selectivity ratio*[2] |
|---|---|---|---|---|---|---|---|---|---|
| | Composition | Volume ratio*[1] | | | | Etching target | | Non-etching target | |
| Ex. 17 | $F_2$/He | 10/90 | 150 | 10 | 3 | Silicon nitride | 68 | Elemental tantalum | Less than 0.1 | More than 660 |
| | | | | | | | | Elemental cobalt | Less than 0.1 | More than 660 |
| | | | | | | | | Elemental copper | Less than 0.1 | More than 660 |
| | | | | | | | | Titanium nitride | Less than 0.1 | More than 660 |
| | | | | | | | | Elemental nickel | Less than 0.1 | More than 660 |
| | | | | | | | | Amorphous carbon | 1 | 66 |
| Ex. 18 | $F_2$/He | 10/90 | 150 | 10 | 3 | Silicon oxide | 5 | Elemental tantalum | Less than 0.1 | More than 50 |
| | | | | | | | | Elemental cobalt | Less than 0.1 | More than 50 |

TABLE 3-continued

| | Etching gas | | Stage temperature (° C.) | In-chamber pressure (kPa) | Etching time (min) | Etching rate (nm/min) | | | Etching selectivity ratio*[2] |
|---|---|---|---|---|---|---|---|---|---|
| | Composition | Volume ratio*[1] | | | | Etching target | | Non-etching target | |
| | | | | | | | | Elemental copper / Less than 0.1 | More than 50 |
| | | | | | | | | Titanium nitride / Less than 0.1 | More than 50 |
| | | | | | | | | Elemental nickel / Less than 0.1 | More than 50 |
| | | | | | | | | Amorphous carbon / 1 | 5 |
| Ex. 19 | $F_2$/Ar | 10/90 | 150 | 10 | 3 | Silicon nitride | 60 | Elemental tantalum / Less than 0.1 | More than 600/more than 50 |
| | | | | | | | | Elemental cobalt / Less than 0.1 | More than 600/more than 50 |
| | | | | | | | | Elemental copper / Less than 0.1 | More than 600/more than 50 |
| | | | | | | Silicon oxide | 5 | Titanium nitride / Less than 0.1 | More than 600/more than 50 |
| | | | | | | | | Elemental nickel / Less than 0.1 | More than 600/more than 50 |
| | | | | | | | | Amorphous carbon / 1 | 60/5 |
| Comp. Ex. 1 | $F_2$/Ar | 10/90 | 30 | 10 | 3 | Silicon nitride | Less than 0.1 | Elemental tantalum / Less than 0.1 | Aprx. 1 |
| | | | | | | | | Elemental cobalt / Less than 0.1 | Aprx. 1 |
| | | | | | | | | Elemental copper / Less than 0.1 | Aprx. 1 |
| | | | | | | | | Titanium nitride / Less than 0.1 | Aprx. 1 |
| | | | | | | | | Elemental nickel / Less than 0.1 | Aprx. 1 |
| | | | | | | | | Amorphous carbon / Less than 0.1 | Aprx. 1 |
| Comp. Ex. 2 | $F_2$/Ar | 10/90 | 30 | 10 | 3 | Silicon oxide | Less than 0.1 | Elemental tantalum / Less than 0.1 | Aprx. 1 |
| | | | | | | | | Elemental cobalt / Less than 0.1 | Aprx. 1 |
| | | | | | | | | Elemental copper / Less than 0.1 | Aprx. 1 |
| | | | | | | | | Titanium nitride / Less than 0.1 | Aprx. 1 |
| | | | | | | | | Elemental nickel / Less than 0.1 | Aprx. 1 |
| | | | | | | | | Amorphous carbon / Less than 0.1 | Aprx. 1 |
| Comp. Ex. 3 | $F_2$/Ar | 10/90 | 400 | 10 | 1 | Silicon nitride | 1870 | Titanium nitride / 720 | 2.6/2.5 |
| | | | | | | Silicon oxide | 1830 | | |
| Comp. Ex. 4 | $IF_7$/Ar | 10/90 | 150 | 10 | 3 | Silicon nitride | Less than 0.1 | Elemental tantalum / Less than 0.1 | Aprx. 1/aprx. 1 |
| | | | | | | | | Elemental cobalt / Less than 0.1 | Aprx. 1/aprx. 1 |

TABLE 3-continued

| | Etching gas | | Stage | In-chamber | Etching | | | | Etching |
|---|---|---|---|---|---|---|---|---|---|
| | | Volume | temperature | pressure | time | Etching rate (nm/min) | | | selectivity |
| | Composition | ratio*[1] | (° C.) | (kPa) | (min) | Etching target | | Non-etching target | ratio*[2] |
| | | | | | | | | Elemental copper | Less than 0.1 | Aprx. 1/aprx. 1 |
| | | | | | | Silicon oxide | Less than 0.1 | Titanium nitride | Less than 0.1 | Aprx. 1/aprx. 1 |
| | | | | | | | | Elemental nickel | Less than 0.1 | Aprx. 1/aprx. 1 |
| | | | | | | | | Amorphous carbon | Less than 0.1 | Aprx. 1/aprx. 1 |
| Ref. Ex. | $F_2$/Ar | 10/90 | 150 | 10 | 30 | — | — | Elemental tantalum | Less than 0.1 | — |
| | | | | | | | | Elemental cobalt | Less than 0.1 | — |
| | | | | | | | | Elemental copper | Less than 0.1 | — |
| | | | | | | | | Titanium nitride | Less than 0.1 | — |
| | | | | | | | | Elemental nickel | Less than 0.1 | — |
| | | | | | | | | Amorphous carbon | 1 | — |

*[1] A volume ratio of fluorine gas to inert gas. For example, when fluorine gas:inert gas = 10:90, it is described as 10/90.
*[2] In Ex. 19 and Comp. Exs. 3 and 4, the etching selectivity ratio of silicon nitride as the etching target is given on the left side of "/", and the etching selectivity ratio of silicon oxide as the etching target is given on the right side of "/".

Example 19

A member to be etched including a silicon oxide film as the etching target, a member to be etched including a silicon nitride film as the etching target, and the above six laminates for comparison were placed side by side on the stage in the chamber of the etching device, and etching was performed in the same manner as in Example 1 to calculate an etching rate of each. Table 3 illustrates the results.

Comparative Examples 1 and 2

Etching was performed in the same manner as in Examples 1 and 2 except that the stage temperature was 30°. Table 3 illustrates the results.

Comparative Example 3

Etching was performed in the same manner as in Example 19 except that the stage temperature was 400° C., the etching time was 1 minute, and the non-etching target of the laminate for comparison was only titanium nitride. Table 3 illustrates the result.

Comparative Example 4

Etching was performed in the same manner as in Example 1 except that the fluorine gas contained in the etching gas was replaced with iodine heptafluoride ($IF_7$) gas. Table 3 illustrates the result.

Reference Example

There were prepared square silicon substrates each having a 2 inch side length formed with a film of a non-etching target (tantalum, cobalt, copper, titanium nitride, nickel, or amorphous carbon) having a film thickness of 100 nm thereon (manufactured by KST World Corporation). Then, a rectangular nickel substrate having a size of 1 inch×2 inch was glued onto the film of each non-etching target using grease (DEMNUM GREASE L-200 manufactured by Daikin Industries, Ltd). The six laminates thus formed were used as laminates for reference example. The nickel substrate was glued to cover approximately a half portion of the film of each non-etching target.

Etching of the six laminates for reference example was performed in the same manner as in Example 1 except that the etching time was 30 minutes, and etching rates of the films of the non-etching targets were calculated. Table 3 illustrates the results.

Example 20

The member to be etched used in Example 20 will be described with reference to FIG. 3. The member to be etched of FIG. 3 has a structure in which silicon nitride films 32 having a film thickness of 35 nm and silicon oxide films 33 having a film thickness of 35 nm were alternately laminated into 30 layers for each on a silicon substrate 31 (for convenience, FIG. 3 illustrates a structure in which the films are alternately laminated into 5 layers for each). Additionally, the member to be etched of FIG. 3 has a structure in which an amorphous carbon film 35 having a film thickness of 1 μm is additionally laminated on an uppermost layer silicon oxide film 33. Here, the silicon nitride films 32 and the silicon oxide films 33 are etching targets, and the amorphous carbon film 35 is a non-etching target. The member to be etched of FIG. 3 further includes a through hole 34 having a diameter of 100 nm that penetrates through the 30-layered silicon nitride films 32, the 30-layered silicon oxide films 33, and the single-layered amorphous carbon film 35 in a laminating direction.

The above member to be etched was placed on the stage of an etching device having substantially the same configuration as that of the etching device of FIG. 1, and the temperature of the stage was raised to 150° C. Next, fluorine gas at a flow rate of 10 mL/min and argon at a flow rate of 90 mL/min were mixed together to form a mixed gas, and the mixed gas was used as the etching gas. Then, the etching gas was supplied into the chamber, and distributed for 1 minute for etching. The pressure in the chamber during the distribution of the etching gas was 10 kPa. After completion of the distribution of the etching gas, the heating of the stage was finished, and the atmosphere in the chamber was replaced with argon.

The chamber was opened to take out the member to be etched. In the member to be etched subjected to the etching, portions of the silicon nitride films 32 exposed on the inner surface of the through hole 34 were etched, and particularly, the silicon nitride films 32 were preferentially etched over the silicon oxide films 33, so that parts of the inner surface of the through hole 34 extended radially outward.

Portions of the silicon oxide films 33 exposed on the inner surface of the through hole 34 were less likely to be etched than those of the silicon nitride films 32, and the amorphous carbon film 35 was hardly etched, which resulted in the formation of a structure in which end portions of the silicon oxide films 33 and the amorphous carbon film 35 protruded in the through hole 34.

The member to be etched taken out was cut, and scanning electron microscopic analysis was performed on cross sections of the 30-layered silicon nitride films 32 and cross sections of the 30-layered silicon oxide films 33, respectively. More specifically, in each of the 30-layered silicon nitride films 32, a radial distance between the portions of the silicon nitride films 32 exposed on the inner surface of the through hole 34 and the portion of the amorphous carbon film 35 exposed on the inner surface of the through hole 34 was measured. Additionally, in each of the 30-layered silicon oxide films 33, a radial distance between the portions of the silicon oxide films 33 exposed on the inner surface of the through hole 34 and the portion of the amorphous carbon film 35 exposed on the inner surface of the through hole 34 was measured.

Specifically, due to the etching, the inner surface of the through hole 34 extended radially outward, increasing the radius of the through hole 34, and the resulting radius difference was measured. Then, the radius difference was divided by the etching time to calculate relative etching rates of silicon nitride and silicon oxide with respect to amorphous carbon. Note that an amorphous carbon etching rate was calculated by comparing diameters of the through hole 34 before and after the etching, but there was almost no change in the diameter thereof.

Then, averages and standard deviations of the etching rates of the 30-layered silicon nitride films 32 and the 30-layered silicon oxide films 33 were calculated to evaluate whether or not a relative etching rate in an in-plane direction (a direction parallel to a film surface) changed depending on the position of the film in the laminating direction, i.e., a relative etching rate uniformity. Table 4 illustrates the results.

TABLE 4

| | Etching gas | | Stage | In-chamber | | | Etching rate | Etching rate standard |
| --- | --- | --- | --- | --- | --- | --- | --- | --- |
| | Composition | Volume ratio*) | temperature (° C.) | pressure (kPa) | Etching time (min) | | average (nm/min) | deviation (nm/min) |
| Ex. 20 | $F_2$/Ar | 10/90 | 150 | 10 | 1 | Silicon nitride | 51 | 2.2 |
| | | | | | | Silicon oxide | 1.0 | Less than 0.5 |
| | | | | | | Amorphous carbon | Less than 0.1 | 0 |
| Ex. 21 | $F_2$/$N_2$ | 10/90 | 150 | 10 | 1 | Silicon nitride | 51 | 1.4 |
| | | | | | | Silicon oxide | 1.0 | Less than 0.5 |
| | | | | | | Amorphous carbon | Less than 0.1 | 0 |
| Ex. 22 | $F_2$/Ar | 10/90 | 80 | 10 | 1 | Silicon nitride | 19 | 1.1 |
| | | | | | | Silicon oxide | 0.6 | Less than 0.5 |
| | | | | | | Amorphous carbon | Less than 0.1 | 0 |
| Ex. 23 | $F_2$/Ar | 1/99 | 150 | 10 | 1 | Silicon nitride | 6 | 1.2 |
| | | | | | | Silicon oxide | 0.5 | Less than 0.5 |
| | | | | | | Amorphous carbon | Less than 0.1 | 0 |
| Ex. 24 | $F_2$/Ar | 10/90 | 150 | 1 | 1 | Silicon nitride | 23 | 1.6 |
| | | | | | | Silicon oxide | 1.2 | Less than 0.5 |
| | | | | | | Amorphous carbon | Less than 0.1 | 0 |

TABLE 4-continued

|  | Etching gas | | Stage | In-chamber | | | Etching rate | Etching rate standard |
|---|---|---|---|---|---|---|---|---|
|  | Composition | Volume ratio*) | temperature (° C.) | pressure (kPa) | Etching time (min) |  | average (nm/min) | deviation (nm/min) |
| Ex. 25 | $F_2$/Ar | 30/70 | 150 | 1 | 1 | Silicon nitride | 72 | 4.9 |
|  |  |  |  |  |  | Silicon oxide | 2.1 | Less than 0.5 |
|  |  |  |  |  |  | Amorphous carbon | Less than 0.1 | 0 |
| Ex. 26 | $F_2$/Ar | 1/99 | 150 | 10 | 5 | Silicon nitride | 6 | 0.5 |
|  |  |  |  |  |  | Silicon oxide | 0.5 | Less than 0.5 |
|  |  |  |  |  |  | Amorphous carbon | Less than 0.1 | 0 |
| Ex. 27 | $F_2$/Ar | 10/90 | 200 | 10 | 1 | Silicon nitride | 78 | 6.2 |
|  |  |  |  |  |  | Silicon oxide | 9.8 | Less than 0.5 |
|  |  |  |  |  |  | Amorphous carbon | Less than 0.1 | 0 |

*)A volume ratio of fluorine gas to inert gas. For example, when fluorine gas:inert gas = 10:90, it is described as 10/90.

Examples 21 to 27

Etching conditions (etching gas composition, stage temperature, in-chamber pressure, and etching time) were set as listed in Table 4, and etching was performed in the same manner as in Example 20 to calculate relative etching rates of silicon nitride and silicon oxide with respect to amorphous carbon. Table 4 illustrates the results.

The results of Examples 1 to 6 show that as the stage temperature increases, the etching rates of silicon nitride and silicon oxide increase.

The results of Examples 7 to 10 show that the smaller the percentage of the inert gas in the etching gas, the faster the etching rates of silicon nitride and silicon oxide.

The results of Examples 15 to 18 show that similar results are obtained even when nitrogen gas or helium is used instead of argon as the inert gas.

The results of Examples 11 to 14 show that the higher the in-chamber pressure, the faster the etching rates of silicon nitride and silicon oxide. The reason for this seems to be that an increased partial pressure of the fluorine gas in the chamber increased a contact frequency between surfaces of the silicon nitride and the silicon oxide and the fluorine gas, and thereby etching proceeded promptly.

The result of Example 19 shows that even under the conditions where silicon nitride and silicon oxide are present in the same chamber, the etching of each thereof proceeds without problems. On the other hand, the results of Examples 1 to 19 and the Reference Example show that the etching of tantalum, cobalt, titanium nitride, copper, nickel, and amorphous carbon hardly proceeds. The results obtained above indicate that using the etching method according to the present embodiment allows silicon nitride and silicon oxide to be selectively etched with respect to the non-etching target.

The results of Comparative Examples 1 and 2 show that when the stage temperature is as low as 30° C., the etching of the etching target hardly proceeds. On the other hand, the result of Comparative Example 3 show that when the stage temperature is as high as 400° C., the etching of the non-etching target proceeds, which indicates that the etching target cannot be selectively etched with respect to the non-etching target.

The result of Comparative Example 4 show that even when etching is performed using iodine heptafluoride gas as the etching gas under the same conditions as in the etching method according to the present embodiment, the etching of the etching target hardly proceeds.

The results of Examples 20 to 27 show that the etching rates of silicon nitride and silicon oxide are increased by increasing the stage temperature, increasing a ratio of the fluorine gas flow rate to the inert gas flow rate, or increasing the in-chamber pressure. On the other hand, even when the type of the inert gas was changed, there was almost no effect on the etching rates.

In addition, a ratio of the etching rate standard deviation of silicon nitride to the etching rate average thereof was approximately from 4 to 8%, which indicates that the etching of the 30-layered silicon nitride films 32 proceeded substantially uniformly regardless of the positions of the silicon nitride films 32 in the laminating direction. In contrast, the etching rate of silicon oxide was smaller than that of silicon nitride under all of the conditions, and the etching rate standard deviation of silicon oxide was less than 0.5 under all of the conditions.

REFERENCE SIGNS LIST

1: Fluorine gas supply unit
2: Inert gas supply unit
3: Fluorine gas flow rate control device
4: Inert gas flow rate control device
5: Fluorine gas supply pipe
6: Inert gas supply pipe
7: Fluorine gas pressure control device
8: Inert gas pressure control device
10: Chamber
11: Stage
12: Member to be etched
13: Exhaust pipe
14: Thermometer
15: Vacuum pump
16: Pressure gauge
21: Silicon substrate
22: Silicon nitride film 23: Nickel substrate
31: Silicon substrate
32: Silicon nitride film
33: Silicon oxide film
34: Through hole
35: Amorphous carbon film

The invention claimed is:

1. An etching method comprising an etching step in which an etching gas containing fluorine gas is brought into contact with a member to be etched including an etching target being a target of etching with the etching gas and a non-etching target not being the target of the etching with the etching gas in an absence of plasma to selectively etch the etching target with respect to the non-etching target, wherein the etching target contains a silicon compound including at least one of a nitrogen atom or an oxygen atom and a silicon atom;
   wherein the non-etching target includes at least one selected from tantalum, cobalt, copper, titanium nitride, nickel, and amorphous carbon;
   wherein the etching step is performed under temperature conditions of from 40° C. to less than 350° C.;
   wherein the etching gas consists of only fluorine gas or consists of a mixed gas consisting of fluorine gas and an inert gas.

2. The etching method according to claim 1, wherein the inert gas is at least one selected from nitrogen gas, helium, argon, neon, krypton, and xenon.

3. The etching method according to claim 2, wherein an amount of the fluorine gas contained in the etching gas is from 0.5% by volume to 70% by volume.

4. The etching method according to claim 1, wherein an amount of the fluorine gas contained in the etching gas is from 0.5% by volume to 70% by volume.

5. The etching method according to claim 1, wherein the non-etching target is used as a resist in the etching of the etching target with the etching gas.

6. The etching method according to claim 1, wherein an etching selectivity ratio being a ratio of an etching rate of the etching target to an etching rate of the non-etching target is 3 or more.

7. A method for manufacturing a semiconductor element, the method using the etching method according to claim 1 to manufacture the semiconductor element, wherein the member to be etched is a semiconductor substrate including the etching target and the non-etching target; and wherein the method comprises a processing step of removing at least a part of the etching target from the semiconductor substrate by the etching.

8. The etching method according to claim 1, wherein the silicon compound is at least one of silicon oxide or silicon nitride.

9. The etching method according to claim 8, wherein the etching step is performed under pressure conditions of from 1 Pa to 100 kPa.

10. The etching method according to claim 8, wherein the etching step is performed under temperature conditions of from 70° C. to 330° C.

11. The etching method according to claim 8, wherein the etching gas is a gas comprising only fluorine gas or is a mixed gas containing fluorine gas and inert gas.

12. The etching method according to claim 8, wherein an amount of the fluorine gas contained in the etching gas is from 0.5% by volume to 70% by volume.

13. The etching method according to claim 1, wherein the etching step is performed under pressure conditions of from 1 Pa to 100 kPa.

14. The etching method according to claim 13, wherein the etching step is performed under temperature conditions of from 70° C. to 330° C.

15. The etching method according to claim 13, wherein the etching gas is a gas comprising only fluorine gas or is a mixed gas containing fluorine gas and inert gas.

16. The etching method according to claim 13, wherein an amount of the fluorine gas contained in the etching gas is from 0.5% by volume to 70% by volume.

17. The etching method according to claim 1, wherein the etching step is performed under temperature conditions of from 70° C. to 330° C.

18. The etching method according to claim 17, wherein the etching gas is a gas comprising only fluorine gas or is a mixed gas containing fluorine gas and inert gas.

19. The etching method according to claim 17, wherein an amount of the fluorine gas contained in the etching gas is from 0.5% by volume to 70% by volume.

* * * * *